United States Patent
Kumbaranthodiyil

(10) Patent No.: US 11,711,094 B2
(45) Date of Patent: Jul. 25, 2023

(54) ALGORITHM FOR HIGH SPEED SAR ADC

(71) Applicant: Analog Devices International Unlimited Company, Limerick (IE)

(72) Inventor: Mahesh Madhavan Kumbaranthodiyil, Kerala (IN)

(73) Assignee: Analog Devices International Unlimited Company, Limerick (IE)

( * ) Notice: Subject to any disclaimer, the term of this patent is extended or adjusted under 35 U.S.C. 154(b) by 92 days.

(21) Appl. No.: 17/558,610

(22) Filed: Dec. 22, 2021

(65) Prior Publication Data
US 2023/0198541 A1 Jun. 22, 2023

(51) Int. Cl.
*H03M 1/12* (2006.01)
*H03M 1/46* (2006.01)

(52) U.S. Cl.
CPC ........... *H03M 1/466* (2013.01); *H03M 1/124* (2013.01)

(58) Field of Classification Search
CPC .... H03M 1/468; H03M 1/002; H03M 1/0617; H03M 1/1014; H03M 1/1057; H03M 1/1061; H03M 1/1245; H03M 1/46; H03M 1/462; H03M 1/68; H03M 1/804; H03M 1/001; H03M 1/08; H03M 1/1023; H03M 1/16; H03M 1/361; H03M 1/38; H03M 1/403; H03M 1/466; H03M 1/742
USPC .......................... 314/150, 155, 156, 165, 172
See application file for complete search history.

(56) References Cited

U.S. PATENT DOCUMENTS

| | | | |
|---|---|---|---|
| 6,440,302 B1 * | 8/2002 | Leipziger | C02F 1/003 210/473 |
| 7,015,841 B2 | 3/2006 | Yoshida et al. | |
| 7,170,493 B2 * | 1/2007 | Lu | G06F 3/0362 361/679.02 |
| 7,199,745 B2 | 4/2007 | Tachibana et al. | |
| 8,497,795 B2 * | 7/2013 | Le Tual | H03M 1/468 341/163 |
| 9,391,624 B1 | 7/2016 | Srinivasa et al. | |
| 9,559,716 B1 * | 1/2017 | Matsui | H03M 1/1061 |
| 9,647,676 B2 | 5/2017 | Srinivasa et al. | |
| 9,853,655 B1 * | 12/2017 | Pernull | G01R 31/016 |
| 10,097,198 B1 * | 10/2018 | Lee | H03M 1/68 |
| 10,348,320 B1 * | 7/2019 | Paulsen | H03M 1/1014 |
| 10,547,321 B2 | 1/2020 | Vinje et al. | |

(Continued)

OTHER PUBLICATIONS

Kardonik, *A Study of SAR DAC and Implementation of 10-bit Asynchronous Design*, University of Texas at Austin, Aug. 2013, 75 pages.

(Continued)

*Primary Examiner* — Linh V Nguyen
(74) *Attorney, Agent, or Firm* — Schwegman Lundberg & Woessner, P.A.

(57) ABSTRACT

High speed, high dynamic range SAR ADC method and architecture. The SAR DAC comparison method can make fewer comparisons with less charge/fewer capacitors. The architecture makes use of a modified top plate switching (TPS) DAC technique and therefore achieves very high-speed operation. The present disclosure proffers a unique SAR ADC method of input and reference capacitor DAC switching. This benefits in higher dynamic range, no external decoupling capacitory requirement, wide common mode range and overall faster operation due to the absence of mini-ADC.

20 Claims, 18 Drawing Sheets

(56) References Cited

U.S. PATENT DOCUMENTS

| | | | | |
|---|---|---|---|---|
| 2012/0274489 A1* | 11/2012 | Chang | ............... | H03M 1/462 |
| | | | | 341/110 |
| 2014/0184432 A1* | 7/2014 | Huang | ............... | H03M 1/1057 |
| | | | | 341/110 |
| 2015/0061904 A1* | 3/2015 | Lee | ............... | H03M 1/1245 |
| | | | | 341/118 |
| 2017/0250699 A1* | 8/2017 | Fuchs | ............... | H03M 1/466 |
| 2021/0343320 A1* | 11/2021 | Horng | ............... | G11C 7/1084 |

OTHER PUBLICATIONS

Lin et al., *An Innovative Successive Approximation Register Analog-to-Digital Converter for a Nine-Axis Sensing System*, Journal of Low Power Electronics and Applications, Appl. 2021, 11, 24 pages.

* cited by examiner

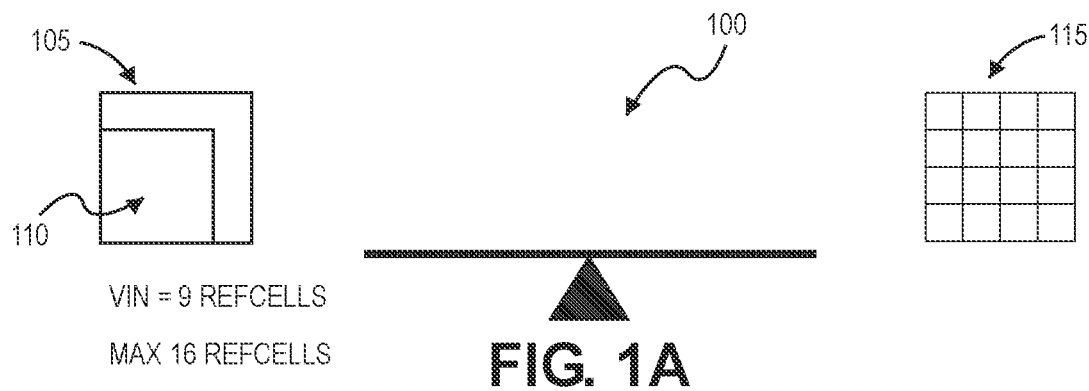
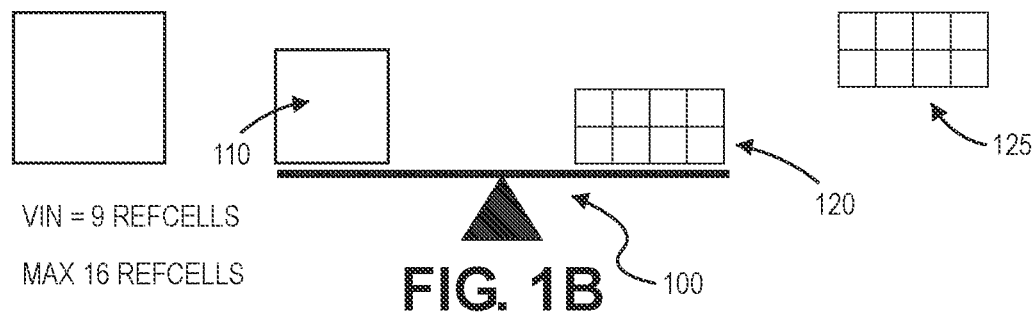
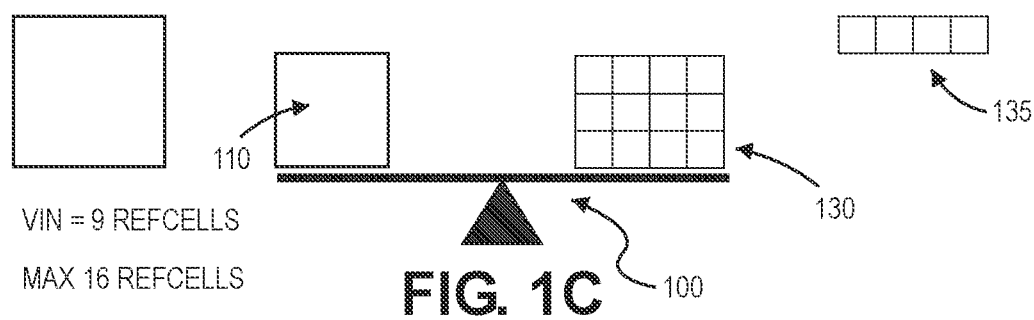
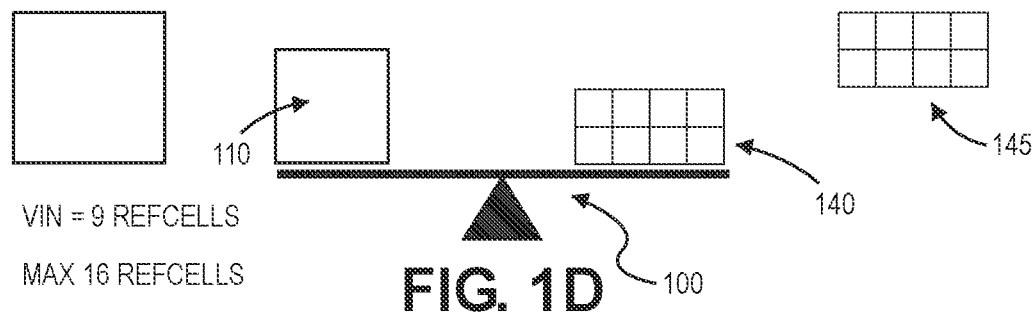

ALGORITHM FOR HIGH SPEED SAR ADC

FIELD OF THE DISCLOSURE

This document pertains generally, but not by way of limitation, to integrated circuits, and more particularly, to analog-to-digital converter circuits and systems.

BACKGROUND

Analog signals and/or values can be produced in various kinds of circuit elements, such as signal generators, sensors, and antennas. However, there can be many instances where having digital signals or values can be beneficial, such as for a processing or storing of the signals or values. To utilize the benefits of having a digital signal or value when an analog signal or value has been produced, analog-to-digital converters (ADCs) have been developed to convert the analog signal or value into a digital signal or value.

A signal may be a time-based sequence of values. A digital value may be represented by a code. A name of a code (for example, CODE1) may refer to a digital value represented by the code. Some (but not all) digital values may be represented by codes using binary-weighted encoding. A resolution of a digital value or code expressed in terms of a number of bits may refer to a binary-weighted encoding, regardless of how it may be encoded.

In many electronics applications, analog input values are converted to digital output values (for example, for further digital processing or storage). For instance, in precision measurement systems, electronics are provided with one or more sensors to make measurements, and these sensors may generate analog values. The analog values may be provided as an input to an ADC to generate digital output values for further processing or storage.

ADCs can be found in many places such as broadband communication systems, automated test equipment, audio systems, vehicles, factory automation systems, etc. ADCs can translate analog electrical values representing real-world phenomena, e.g., light, sound, temperature, flow, or pressure. Designing an ADC is a non-trivial task because each application may have different needs in speed, performance, power, cost and size. As the applications needing ADCs grow, the need for accurate and reliable conversion performance also grows.

It is a general object of the present invention to provide a successive approximation A/D converter that substantially obviates one or more problems caused by the limitations and disadvantages of the related art.

Features and advantages of the present invention will be presented in the description which follows, and in part will become apparent from the description and the accompanying drawings or may be learned by practice of the invention according to the teachings provided in the description. Objects as well as other features and advantages of the present invention will be realized and attained by a successive approximation A/D converter particularly pointed out in the specification in such full, clear, concise, and exact terms as to enable a person having ordinary skill in the art to practice the invention.

There is a demonstrated need in the art for a wider common mode range for both reference and input and a reference buffer which is easier to design. There is also a demonstrated need to remove the mini-ADCs which are present in many systems. The inventors of the present disclosure have recognized that an impediment to low power and higher speeds. As such, the inventors contemplate a new comparison algorithm.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY OF THE DISCLOSURE

High speed, high dynamic range SAR ADC method and architecture. The SAR DAC comparison method can make fewer comparisons with less charge/fewer capacitors. The architecture makes use of a modified top plate switching (TPS) DAC technique and therefore achieves very high-speed operation. The present disclosure proffers a unique SAR ADC method of input and reference capacitor DAC switching.

This benefits in removing the requirement for a mini-ADC for the same input swings. Therefore, this achieves better input bandwidth/redundancy usage compared to mini-ADC type architectures.

This also benefits in higher dynamic range for lower level input. The switching scheme results in lower reference caps for lower inputs thereby achieving lower input referred noise gain of residual amplifier (RA) and lower attenuation for ADC comparator inputs. The inventor of the present disclosure has recognized a 6 dB SNR improvement over traditional T/H based ADCs. This also make T/H based architecture more attractive for wide common mode range implementation as there is no need for two parallel mini-ADCs. This achieves lower complexity and consequently lower area and less power consumption. As such, the speed of the state-of-the-art architectures are maintained (and even exploited) without any reduction to SNR due to attenuation of reference caps, in addition to intention attenuation of caps of the DAC top plate to control voltage swing.

The present disclosure utilizes an ADC architecture which has symmetrical reference and input paths. This can be generalized to make a state-of-the-art "digitizer" that outputs the ratio of two inputs. So, instead of converting two inputs (using sim sampling ADC) and taking their ratio digitally, the generic form of this architecture could give that result using half the circuit layout area. The generic form of one or more embodiments has the ability to convert inputs greater than reference for overranging inputs.

Since the conversion happens entirely internal to the ADC block and no external signals like reference used during, it makes for a good candidate for embedded SAR which could run with no external decoupling capacitor. Also, the benefits in that the DAC resistances can be better controlled and easier for DAC design to make for very fast settling by matching the time constants in each DAC element.

Another advantage of the present disclosure is an inbuilt and on-demand redundancy. A redundancy can be implemented without affecting the attenuation inputs due to extra capacitors in the conversion DAC for inputs inside the [0, VREF] range. The existing DAC capacitors can be manipulated to generate voltage levels needed for redundancy implementation without needing additional caps tied to REF/GND on the conversion DAC. Extra redundant cap can be included with more segments in the reference DAC than required to attend to overranging. This can be added if the input is outside the rails, and therefore the SNR hit due to redundancy cap attenuation is only for inputs greater than full scale or less than negative full scale.

To achieve these and other advantages in accordance with the purpose of the invention, the disclosure provides a successive approximation A/D converter and algorithm thereof, which includes a sample-hold amplifier circuit configured to sample and hold an input analog voltage to produce at an output node an internal analog voltage proportional to the input analog voltage with a voltage gain being smaller than 1, a switched capacitor D/A converter coupled to the output node of the sample-hold amplifier circuit and including a plurality of capacitors for storing electric charge responsive to the internal analog voltage, the switched capacitor D/A converter configured to switch couplings of the capacitors in response to a control signal to produce at an output node a comparison analog voltage responsive to the internal analog voltage and the control signal, a comparator coupled to the output node of the switched capacitor D/A converter to produce at an output node a comparison result signal responsive to the comparison analog voltage, and a control circuit coupled to the output node of the comparator to supply the control signal responsive to the comparison result signal to the switched capacitor D/A converter.

The drawings show exemplary SAR algorithm and configurations. Variations of these circuits, for example, changing the positions of, adding, or removing certain elements from the circuits are not beyond the scope of the present invention. The illustrated circuits, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

Fora fuller understanding of the nature and advantages of the present invention, reference is made to the following detailed description of preferred embodiments and in connection with the accompanying drawings, in which:

FIGS. 1A-G demonstrate an exemplary successive approximation algorithm, in accordance with some embodiments of the disclosure provided herein;

DETAILED DESCRIPTION

SAR analog-to-digital converters utilize a binary weighted capacitor array which is operable to operate in a tracking or sample mode wherein an input voltage is sampled onto one plate of a plurality of capacitors in the array. After sampling, the SAR converter is placed in a convert mode. In the convert mode, the plates of the capacitors that were connected to the input voltage are selectively connected between ground and a reference voltage. A comparator connected to the other plate of the capacitors is operable to compare the voltage on that plate with the threshold voltage in accordance with a conventional SAR search algorithm.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

In many electronics applications, an analog input signal is converted to a digital output signal (e.g., for further digital signal processing). For instance, in measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

Embodiments generally relate to electronic circuit designs, and more specifically to improvements in architectural arrangements which enable enhanced performance and/or features for sampling receivers, and specifically to direct conversion sampling receivers which include a successive approximation analog-to-digital converter (SAR-ADC) to enhance quality of sampling receivers, where the SAR-ADC incorporates a current redistribution digital-to-analog converter (DAC) and where filtering is implemented in the radio frequency (RF) domain by at least reusing a capacitor arrays which form all or part of the DAC within the SAR ADC.

Figure 1E:
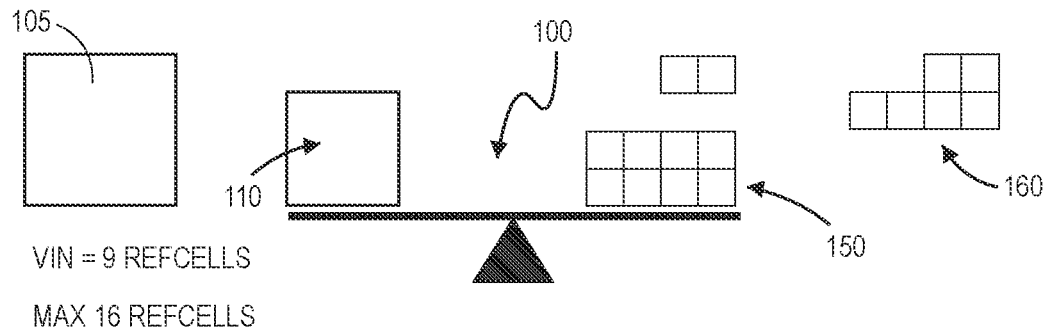

FIGS. 1A-G demonstrate an exemplary successive approximation algorithm, in accordance with some embodiments of the disclosure provided herein. FIG. 1A begins with a standard set-decide-keep principle which is common in the art.

Comparator 100 is a heuristic depiction of a comparator. A comparator is a device that compares two voltages or currents and outputs a digital signal indicating which is larger.

A comparator consists of a specialized high-gain differential amplifier. They are commonly used in devices that measure and digitize analog signals, such as successive-approximation ADCs, as well as relaxation oscillators. A successive-approximation ADC is a type of analog-to-digital converter that converts a continuous analog waveform into a discrete digital representation using a binary search through all possible quantization levels before finally converging upon a digital output for each conversion.

The successive-approximation analog-to-digital converter circuit typically consists of four chief subcircuits. A sample-and-hold circuit to acquire the input voltage Vin. An analog voltage comparator that compares Vin to the output of the internal DAC and outputs the result of the comparison to the successive-approximation register (SAR). A successive-approximation register subcircuit designed to supply an approximate digital code of Vin to the internal DAC. An internal reference DAC that, for comparison with Vref, supplies the comparator with an analog voltage equal to the digital code output of the SARin.

Commonly in the art, the successive approximation register is initialized so that the most significant bit (MSB) is equal to a digital 1. This code is fed into the DAC, which then supplies the analog equivalent of this digital code (Vref/2) into the comparator circuit for comparison with the sampled input voltage. If this analog voltage exceeds Vin, then the comparator causes the SAR to reset this bit; otherwise, the bit is left as 1. Then the next bit is set to 1 and the same test is done, continuing this binary search until every bit in the SAR has been tested. The resulting code is the digital approximation of the sampled input voltage and is finally output by the SAR at the end of the conversion (EOC).

Turning to FIG. 1A, Vin 110 is represented by 9 reference cells, while Vmax 105 represents 16 reference cells. For the purposes of discussion, Vmax 105 would be the circuit's maximum input laid out in manufacture's specification. References cells are quantized based on the reference block 115 on the right side of the comparator. 100. Since a 4-bit ADC is simulated, reference block 115 has 16 ($2^4$) reference cells. Reference cells can represent voltage, charge or any suitable physical property.

In FIG. 1B, comparator 100 compares Vin 110 with MSB cells 120. With few exceptions, the state of the art commences with the comparison to the most significant bit (MSB). Here, MSB cells 120 are eight ($2^3$) reference cells because this is a 4-bit circuit with the remaining 8 reference cell 125 as the lowest three bits. The binary determination of the most significant bit is made by weighing Vin 110 against MSB cells 120. It can be appreciated that Vin has larger value than MSB cells 120. Consequent, the most significant bit is a "1."

Since the most significant bit is a "1," the reference cells 120 remain on the scale. In FIG. 1C, comparator 100 continues with the next significant cells 130 which comprise MSB cells 120 and are four ($2^2$) more reference cells with the remaining 4 reference cells 135 as the lowest two bits. The binary determination of the second most significant bit is made by weighing Vin 110 against cells 130. It can be appreciated that Vin has a smaller value than cells 130. Consequently, the next significant bit is a "0."

In FIG. 1D, the additional reference cells are removed off the scale, since the next significant bit is a "0." The MSB cells 140 remain. In FIG. 1E, comparator 100 continues with the next significant cells 150 which comprise MSB cells 120 and are two ($2^1$) more reference cells with the remaining 2 reference cells 160 as the lowest two bits along with the prior removal. The binary determination of the third most significant bit is made by weighing Vin 110 against cells 150. It can be appreciated that Vin has a smaller value than cells 150. Consequently, the next significant bit is a "0."

Figure 1F:
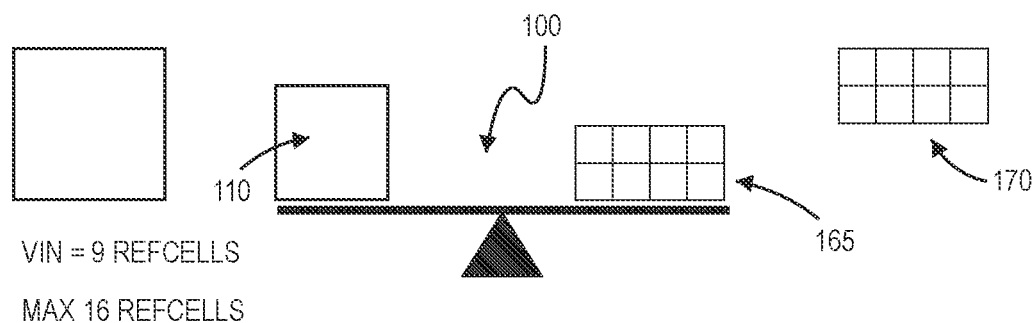
Figure 1G:
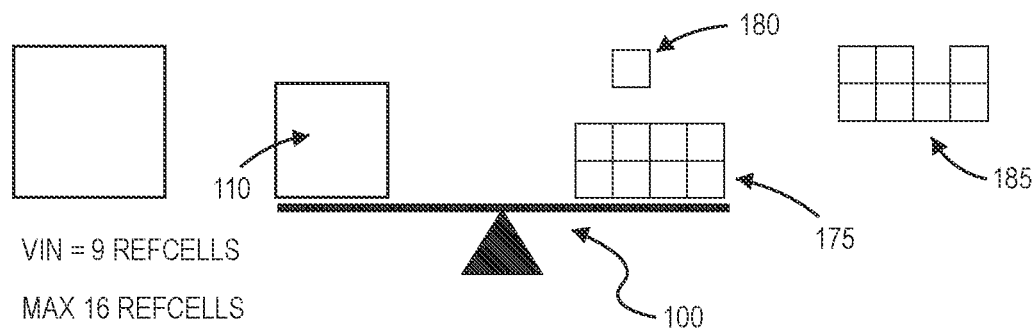

In FIG. 1F, the additional reference cells are removed off the scale, since the next significant bit is a "0." The MSB cells 165 remain. In FIG. 1G, comparator 100 continues with the least significant cells 180 and MSB cells 175. The last ($2^0$) reference cells and other subtraction are comprised by leftover cells 185. The binary determination of the least significant bit is made by weighing Vin 110 against cells 180 plus cells 175. While the comparison is an academic push, a circuit comparator would make some sort of determination, in practice. For the sake of discussion let's say that, the least significant bit is a "1." As a result of sampling, the binary result is determined to be 1 0 0 1.

Figure 2A:
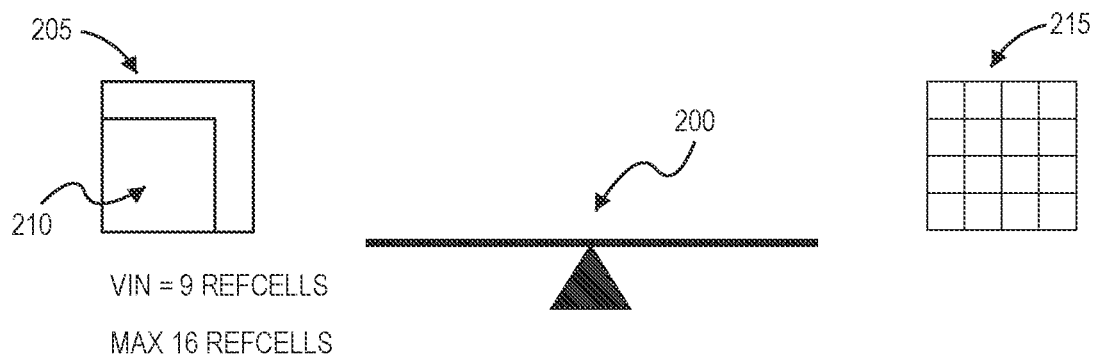
FIGS. 2A-F demonstrate an exemplary novel successive approximation algorithm, in accordance with some embodiments of the disclosure provided herein.
Figure 2B:
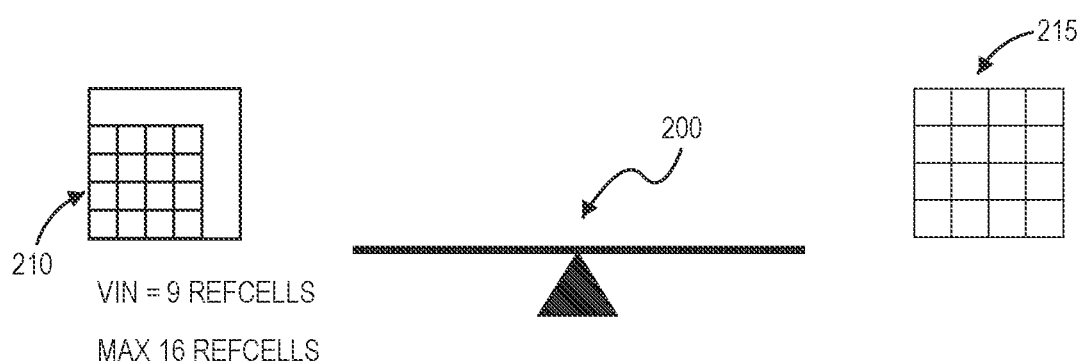

FIGS. 2A-F demonstrate an exemplary novel successive approximation algorithm, in accordance with some embodiments of the disclosure provided herein. Turning to FIGS. 2A-B, Vin 100 is represented by 9 reference cells, while Vmax 105 represents 16 reference cells. However, in the present embodiment, the 9 reference cell of Vin 210 are subdivided into 16 input cells. Specifically, Vin 210 is quantized into the same number of cells as the reference cell but not necessarily of the same size and/or value. Since this is a 4-bit ADC, both are 16 cells. However, any number of divisions and not beyond the scope of the current disclosure—even disparities and inequities in divisions.

For the purposes of discussion, Vmax 205 would be the circuit's maximum input laid out in manufacture's specification. References cells are quantized based on the reference block 215 on the right side of the comparator 200. Since a 4-bit ADC is simulated, reference block 215 has 16 ($2^4$) reference cells. Again, reference and input cells can represent voltage, charge or any suitable physical property. It is also noted that the value of Vin being equivalent to 9 reference cells is chosen for didactic reasons and to parallel the previous process for clarity. However, Vin can be any value which is split into segments in accordance with the resolution of the ADC/DAC.

Figure 2C:
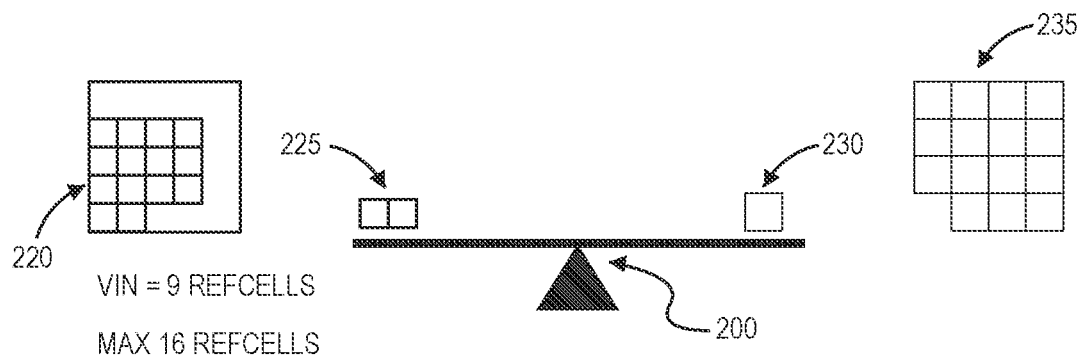

In FIG. 2C, comparator 200 compares two input cells 225 with one reference cell 230. While this may be counterintuitive to one skilled in the art, the first comparison is still the most significant bit. The balance of input cells 220 and reference 235 are not a part of the comparison. It can be appreciated from the mathematics, that 2 input cells 225 (2*9/16, where 9/16 is the unitless value of the input cells) are greater than one reference cell 230. As such, the binary determination of the most significant bit of the most significant bit is a "1."

Figure 2D:
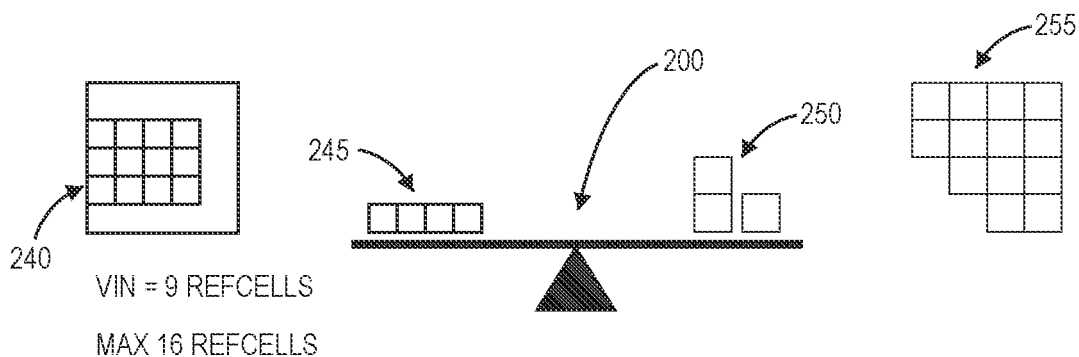

Since the most significant bit is a "1," the reference cell 200 not only remains on the scale but is doubled. Similarly, input cells 225 are doubled 245. Additionally, another reference cell is added into 250 due to the next bit trial. In FIG. 2D, comparator 200 continues with the weighing thereof. It can be appreciated from the mathematics, that 4 input cells 245 (4*9/16, where 9/16 is the unitless value of the input cells) are less than 3 reference cells 250. Consequently, the determination of next significant bit is a "0."

Figure 2E:
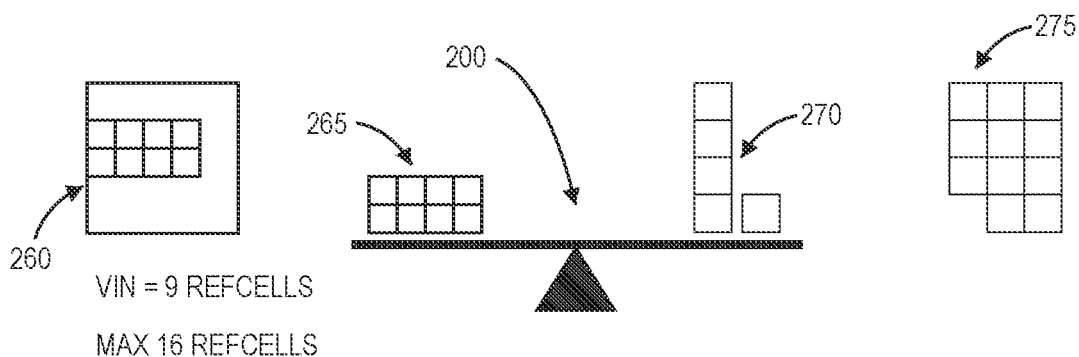

Turning to FIG. 2E, the reference cells from the first trial of the most significant bit are doubled, since the most significant bit is a "1." Whereas, the reference cell from the second trial is removed. And, because, this is the third trial, another cell is put its place. Consequently, reference cells comprise 4 cells from the first trial, none from the second and one from the third. As with the previous steps, input cells 245 are doubled to input cells 265. In FIG. 2E, comparator 200 continues with the weighing of input cells 265 and reference cells 270. It can be appreciated from the mathematics, that 8 input cells 265 (8*9/16, where 9/16 is the unitless value of the input cells) are less than 5 reference cells 270. Consequently, the determination of next significant bit is a "0."

Figure 2F:
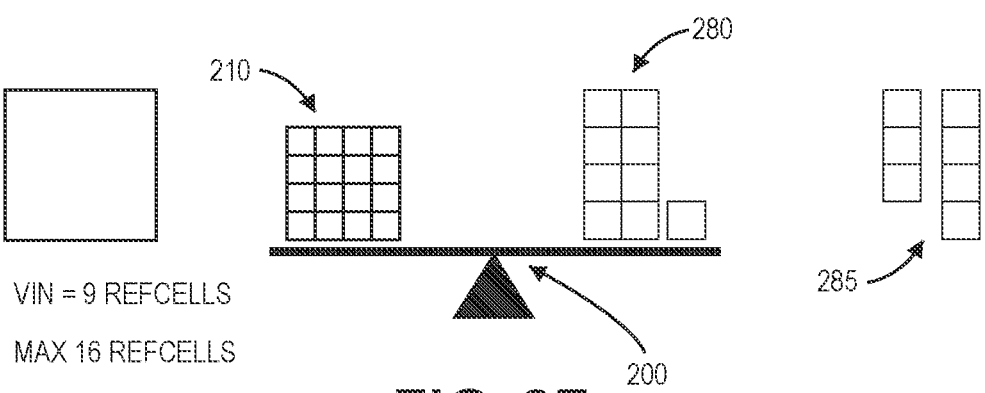

Turning to FIG. 2F, the reference cells from the first trial of the most significant bit are doubled, since the most significant bit is a "1." Whereas, the reference cell from the second trial and third trails are removed because their binary determination results in "0." And, because, this is the fourth trial, another cell placed onto the scale. Consequently, reference cells comprise 8 cells from the first trial, none from the second, none from the third and one from the last trial. As with the previous steps, input cells 265 are doubled to input cells 210, which represent the full scale of the input (but not the ranges of the input, it is noted).

In FIG. 2E, comparator 200 continues with the weighing of input cells 210 and reference cells 280. It can be appreciated from the mathematics, that 16 input cells 210 (16*9/16, where 9/16 is the unitless value of the input cells) are equal to 9 reference cells 280. While the comparison is an academic push, a circuit comparator would make some sort of determination, in practice. For the sake of discussion let's say that, the least significant bit is a "1." As a result of sampling, the binary result is determined to be 1 0 0 1. The implementation of this algorithm as well its significant benefits will now be discussed in detail.

Figure 3A:
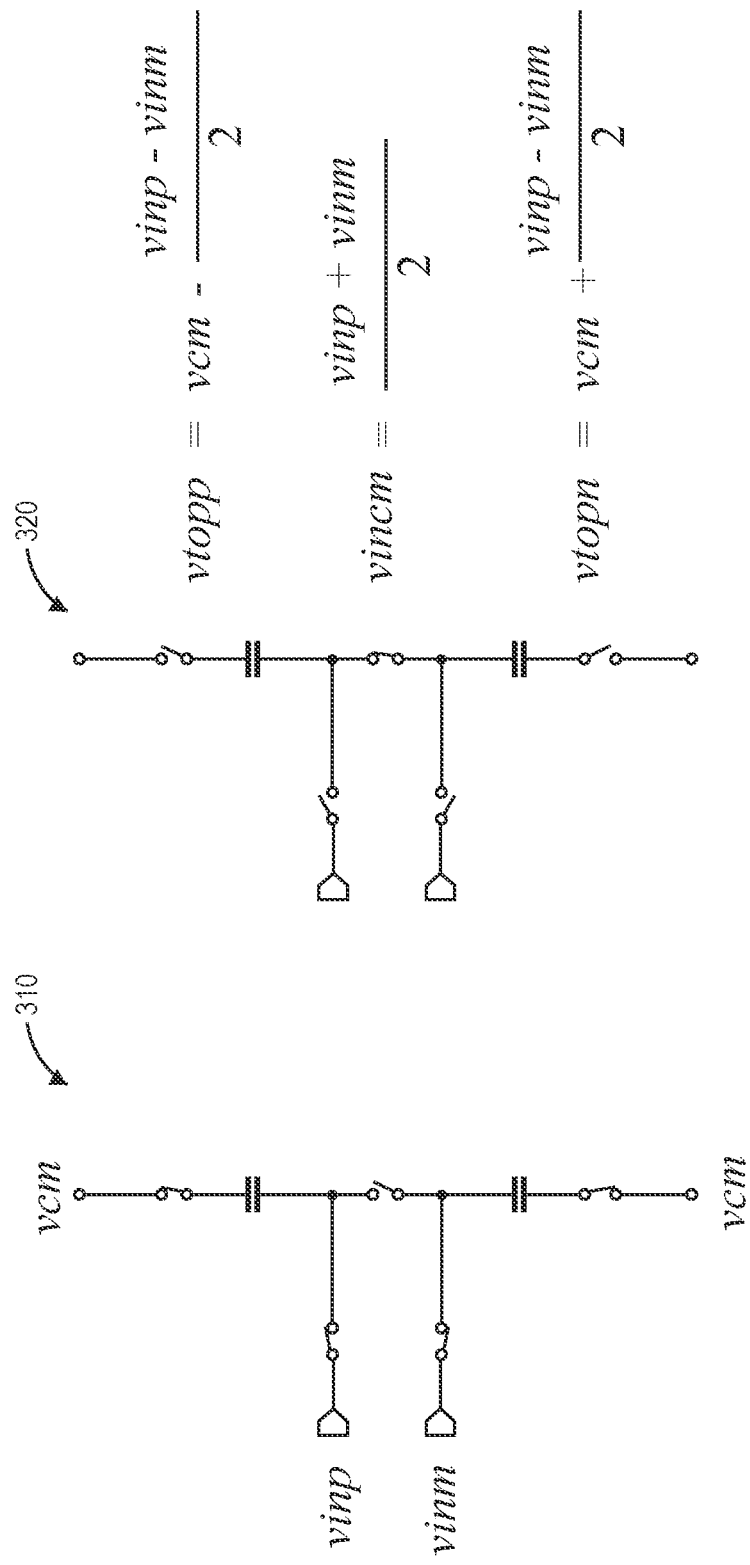
FIGS. 3A-B show exemplary capacitors used in successive approximation, in accordance with others embodiments of the disclosure provided herein.
Figure 3B:
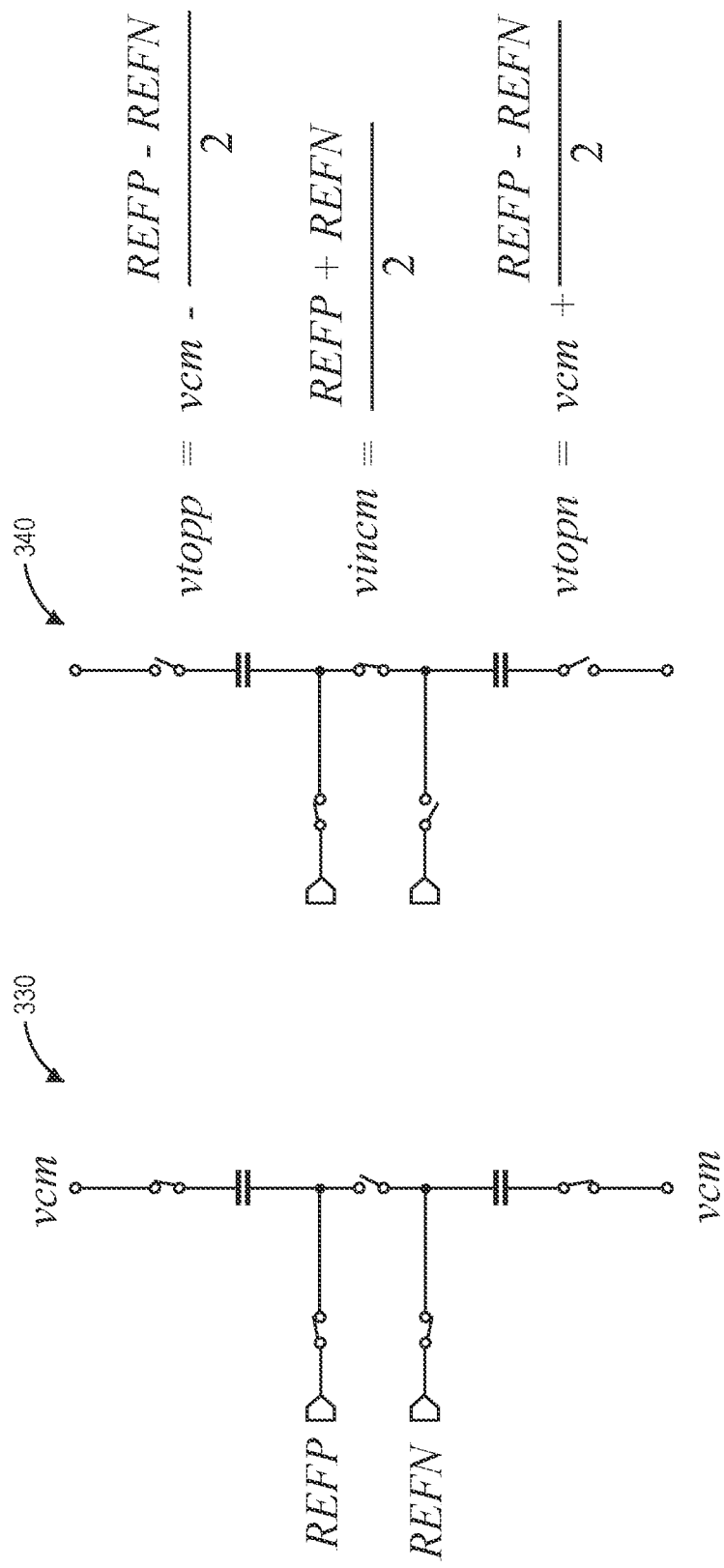

FIGS. 3A-B shows exemplary capacitors used in successive approximation, in accordance with others embodiments of the disclosure provided herein. In several applicable embodiments, redundant capacitors are used. Redundant capacitors reduce the voltage and/or charge swings seen by the comparator. This is useful for lower power systems and also increases dynamic range. On the other hand, redundant capacitors increases the noise gain or the transfer function of noise in the SAR ADC. As such, the signal-to-noise (SNR) decreases with an increase in redundancy.

Circuit 310 comprises two capacitors, p-cap (top) and n-cap, wired in series with their respective bottom plates separated by a switch 315. In this configuration, switch 315 is open. The top plates of both capacitors are exposed to common mode node. At the same time, Vinp (plus) is applied to the bottom plate of the p-cap, while Vinm (minus) is applied to the bottom plate of n-cap. One skilled in art will note this convention, as plus/minus doesn't necessarily connote polarity. Voltage polarity is determined during comparison which will discussed in FIG. 4B.

Turning to the configuration in circuit 320, the capacitors remain the same. However, in the present configuration, the inputs are removed and switch 325 is closed to short the bottom plates. The resultant voltages across the capacitors are depicted in FIGS. 3A-B. The transition is used in sample and hold process and the charges are now ready for comparison in the ADC.

Similarly, circuit 330 comprises two capacitors, p-cap (top) and m-cap, wired in series with their respective bottom plates separated by a switch 335. In this configuration, switch 335 is open. The top plates of both capacitors are exposed to common mode node. At the same time, Refp (positive) is applied to the bottom plate of the p-cap, while Refn (negative) is applied to the bottom plate of n-cap. It can be appreciated these capacitors are used as the basis for comparison to the input capacitors. That is, these are reference capacitors commonly used in ADCs and DACs.

Turning to the configuration in circuit 340, the capacitors remain the same. However, in the present configuration, the inputs are removed and switch 345 is closed to short the bottom plates. The resultant voltages across the capacitors are depicted in FIGS. 3A-B. The transition is used in DAC process and the charges are now ready for comparison in the ADC.

FIGS. 4A-E illustrates the implementation of an exemplary successive approximation algorithm in operation, in accordance with others embodiments of the disclosure provided herein. ADC 400 comprises input capacitor bank 420, reference capacitor bank 410, and comparator 430. In assigning Vin to equal +5LSBs, FIG. 4A begins in neutral state prior to processing. It is noted that input and references voltages have already been applied and the capacitor banks isolated pursuant to the description associated with FIGS. 3A-B.

Figure 4A:
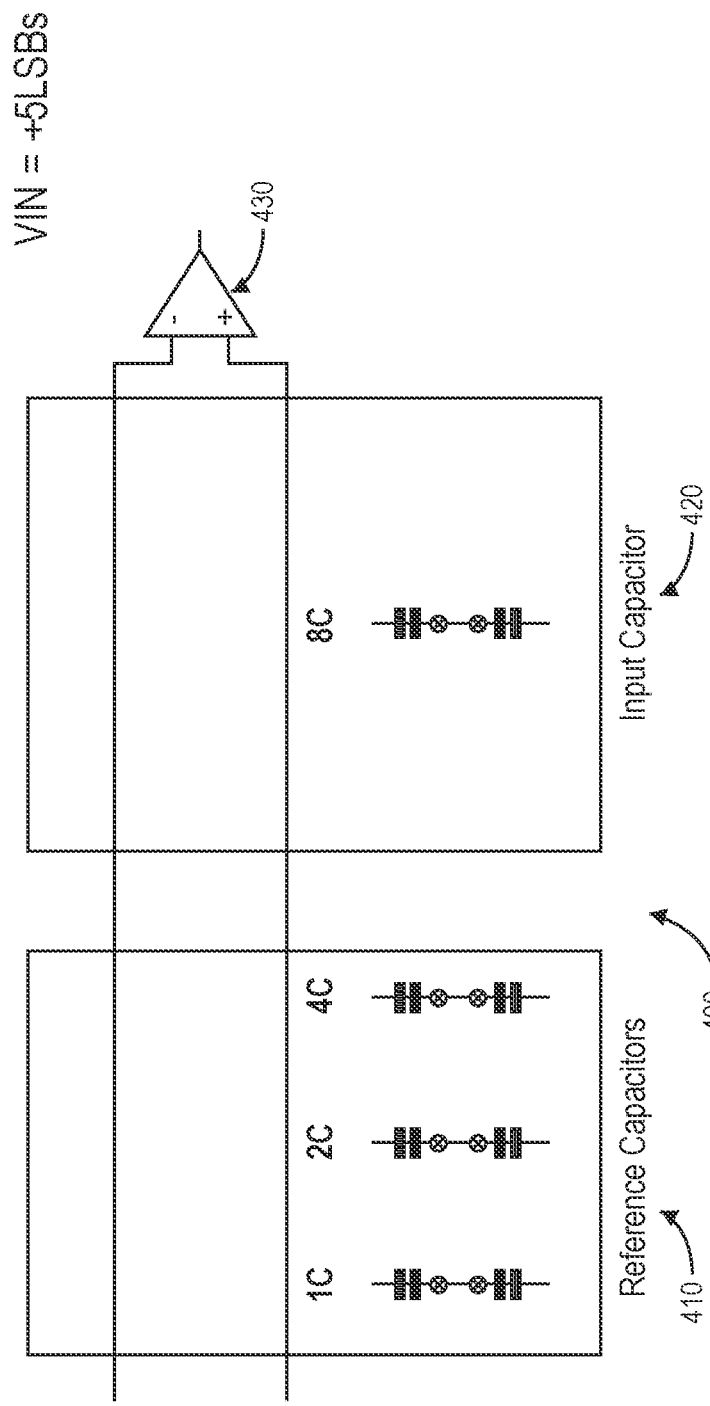
FIGS. 4A-E illustrates the implementation of an exemplary successive approximation algorithm in operation, in accordance with others embodiments of the disclosure provided herein.
Figure 4B:
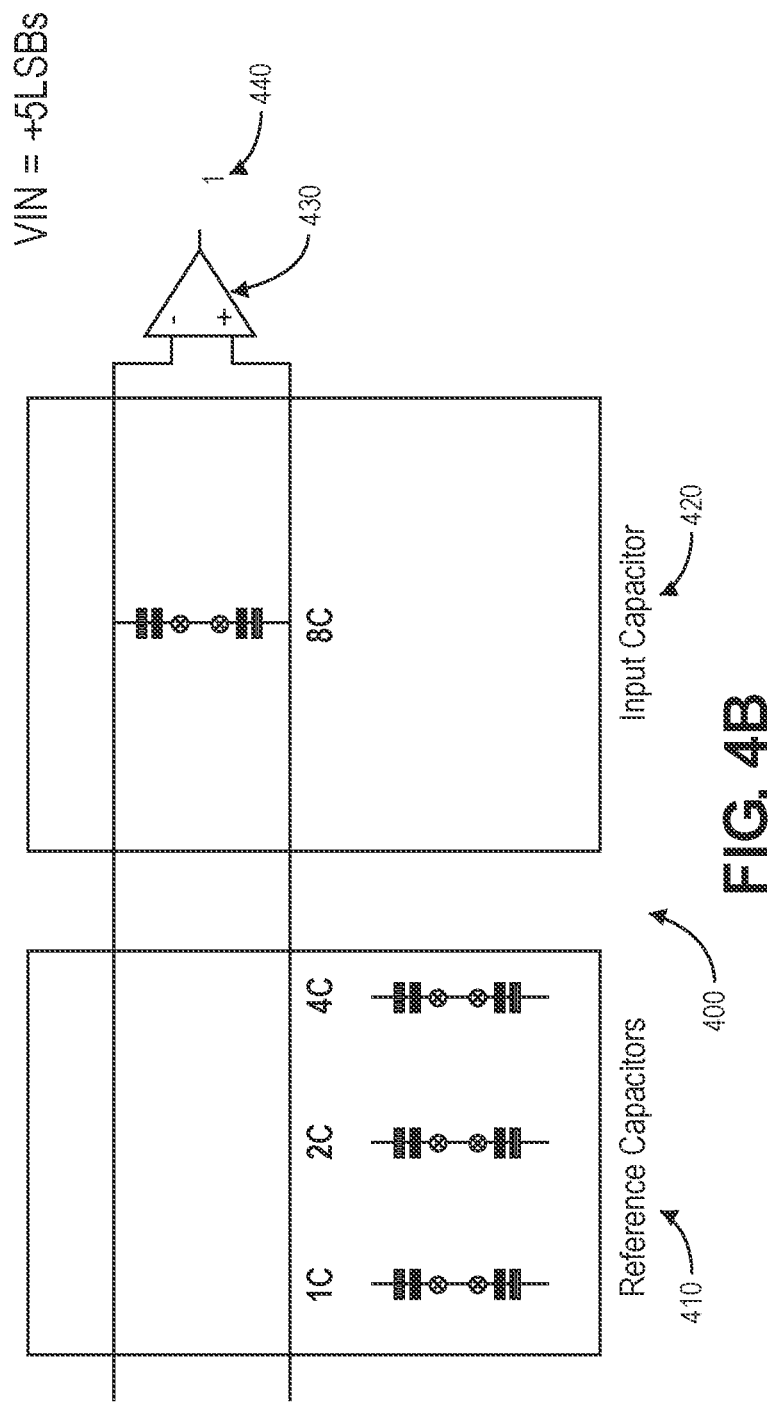

FIG. 4B commences by measuring the polarity of the voltage state (e.g., charge) across the capacitors. Input capacitors 420 are applied to comparator 430. The result is "1" 440 to denote positive polarity. This will be used in the application direction of the subsequent reference capacitors.

Figure 4C:
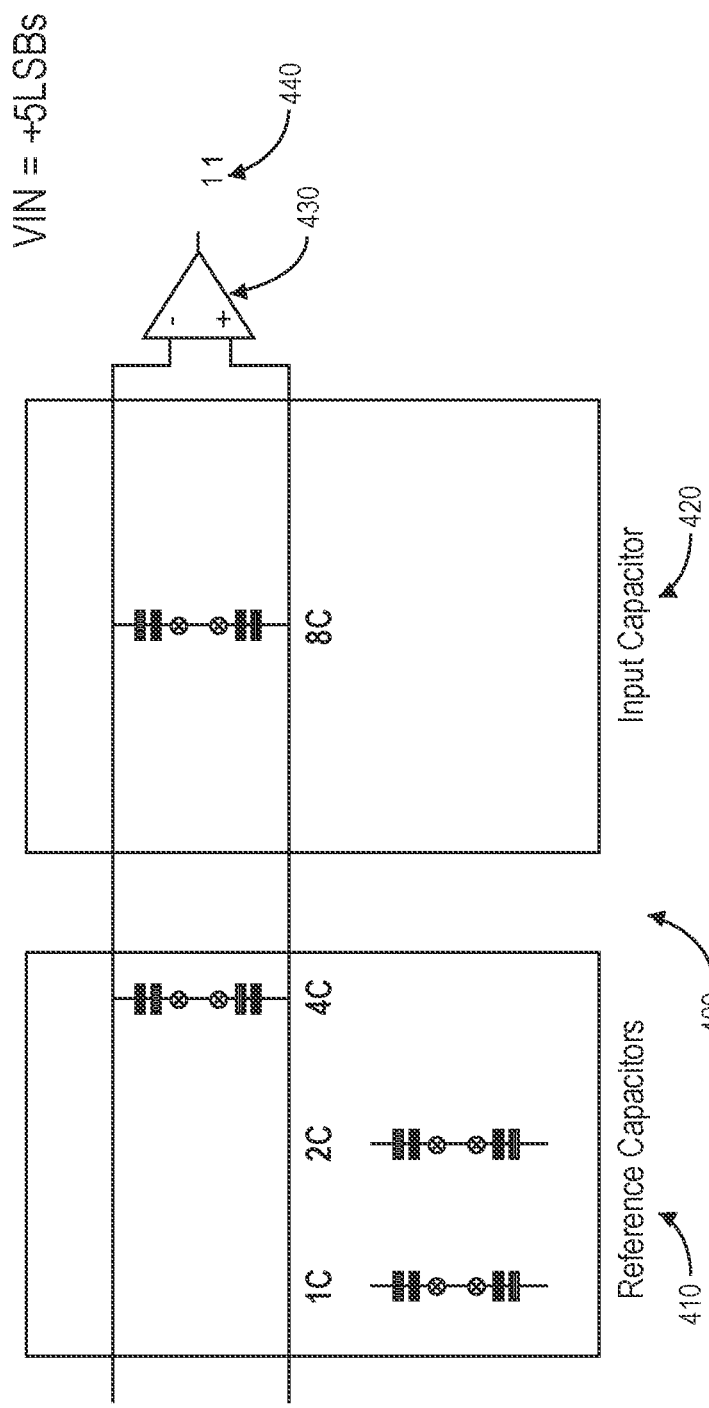

FIG. 4C continues by comparing input capacitors 420 and 4C from reference capacitors 410 are applied to comparator 430. Because the polarity was determined to be "1," C is oriented in the opposite direction with the object being cancel and/or balancing the charge rather than adding to it. Because the charge on the input capacitor(s) (+5LSB) is greater than 4C of the reference capacitor, the most significant bit is determined to be "1" at the comparator 430 because the positive terminal still sees a higher value than the negative terminal. The result is "1 1" 440 to denote positive polarity and MSB.

Figure 4D:
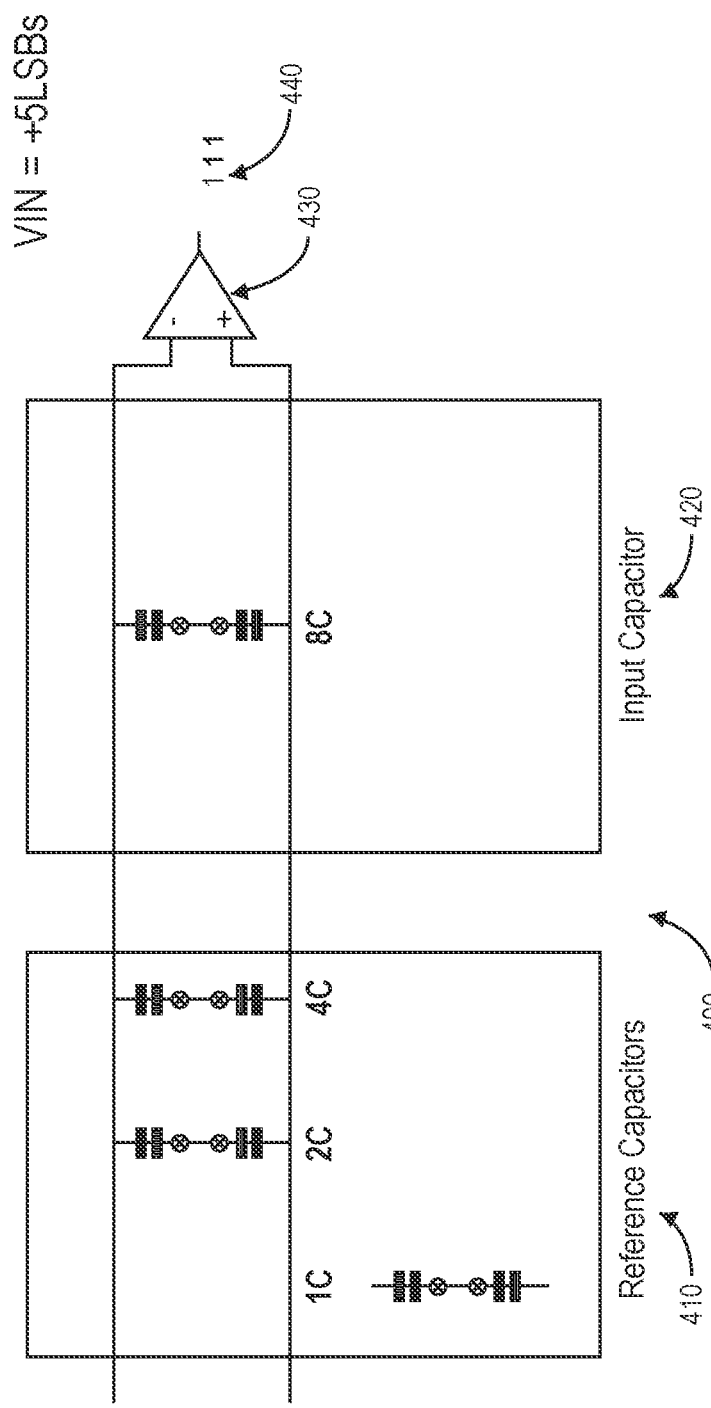

FIG. 4D continues by comparing input capacitors 420 and 4C and 2C from reference capacitors 410 are applied to comparator 430. Because the previous comparison was determined to be "1," 2C is oriented in the opposite direction of the input capacitors with the object being cancel and/or balancing the charge. Because the charge on the input capacitor(s) (+5LSB) is less than 4C+2C (at full charge) of the reference capacitor, the next significant bit is determined to be "0" at the comparator 430 because the positive terminal still sees a lower value than the negative terminal. The result is "1 1 0" 440 to denote positive polarity and MSB and next binary bit.

Figure 4E:
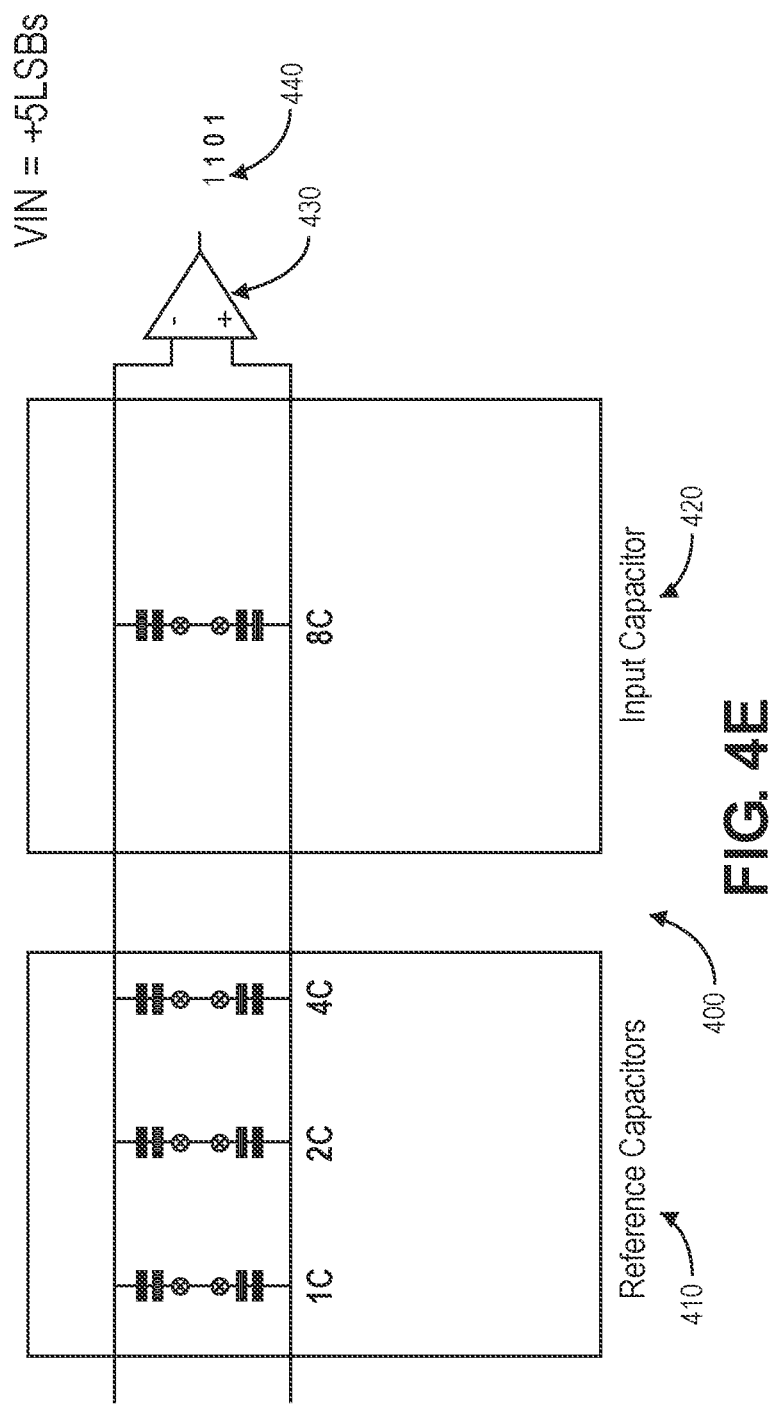

FIG. 4E continues by comparing input capacitors 420 and 4C, 2C and 1C from reference capacitors 410 are applied to comparator 430. Because the previous comparison was determined to be "0," 1C is oriented in the same direction of the input capacitors with the object being cancel and/or balancing the charge. The charge on the input capacitor(s) (+5LSB) is now equal to 4C+2C−1C (at full charge). While the comparison is an academic push, a circuit comparator would make some sort of determination, in practice. For the sake of discussion let's say that, the least significant bit is a "1." As a result of sampling, the binary result is determined to be "1 1 0 1" 440.

Figure 5:
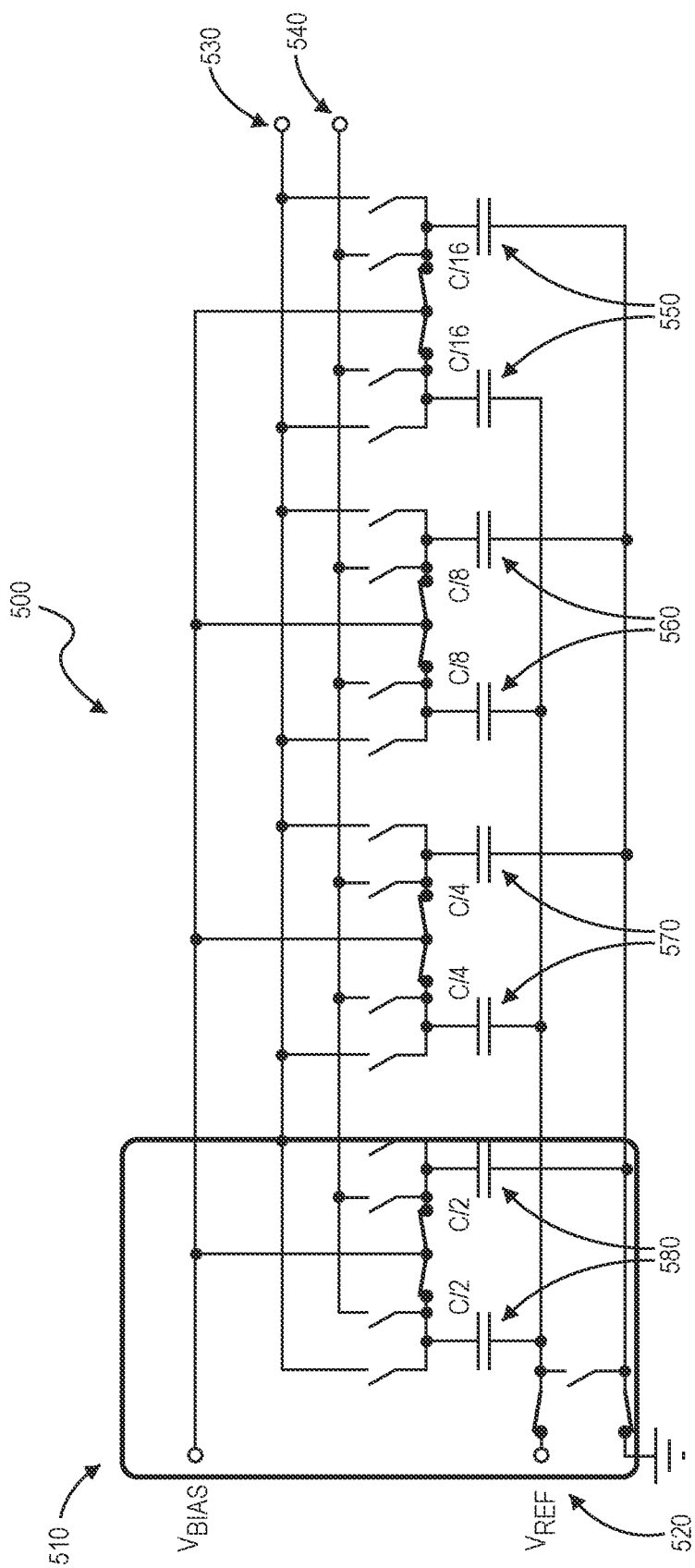
FIG. 5 depicts an exemplary schematic of an exemplary DAC at least in part, in accordance with others embodiments of the disclosure provided herein.

FIG. 5 depicts an exemplary schematic of an exemplary ADC 500 at least in part, in accordance with others embodiments of the disclosure provided herein. ADC 500 comprises input block first cap pair 580, second cap pair 570, third cap pair 560, fourth cap pair 550, positive comparator lead 540, and negative comparator lead 530. While ADC 500 is depicted to demonstrate implementation of the algorithms discussed herein, the present disclosure is not limited to this architecture in any way.

Input block comprises Vbias (e.g., common mode voltage), ground, and Vref 520 switching. Capacitor are paired up for attenuation purposes with the appropriate switching network to satisfy the previously described conditions. It can be appreciated the cap pairs begin with the most significant bit 580 and end with the least significant bit of cap pair 550. Positive comparator lead 540 and negative comparator lead 530 merely represent prospective inputs to a comparator. One skilled in the art will note this an isolating architecture. That is, Vref 520 and ground can be opened to be provide for a floating ground. This gives rise to faster switching rating as the parasitic inductances are cut off and removed thereby reducing circuit ringing.

This new method of input and reference capacitor DAC switching has the benefits of higher dynamic range, no external decoupling capacitor required, and a wide common mode range. Furthermore, many states of the art SAR ADCs are only able to achieve wider input range with the inclusion of a mini-ADC. Although wired in parallel, a mini-ADC runs a pre-curser range analysis before passing the results to the main ADC. The present disclosure eliminates the necessity of mini-ADC while achieving the same high operation voltages. The mini ADC achieves wider input range. Mini ADC has the disadvantage of mismatch errors between mini-ADC and main ADC, which becomes dominant at faster input frequencies.

FIGS. 6A-D illustrates the implementation of an exemplary novel successive approximation algorithm in operation, in accordance with others embodiments of the disclosure provided herein. ADC 600 comprises input capacitor bank 620, reference capacitor bank 610, and comparator 630. In assigning Vin to equal +5LSBs, FIG. 6A begins in neutral state prior to processing. Contrary to process elucidated in FIGS. 4A-E, Vin in divided up among 8 1C input caps. The present embodiment exemplifies a 3-bit ADC process. It is noted that input and references voltages have already been applied and the capacitor banks isolated pursuant to the description associated with FIG. 3.

Figure 6A:
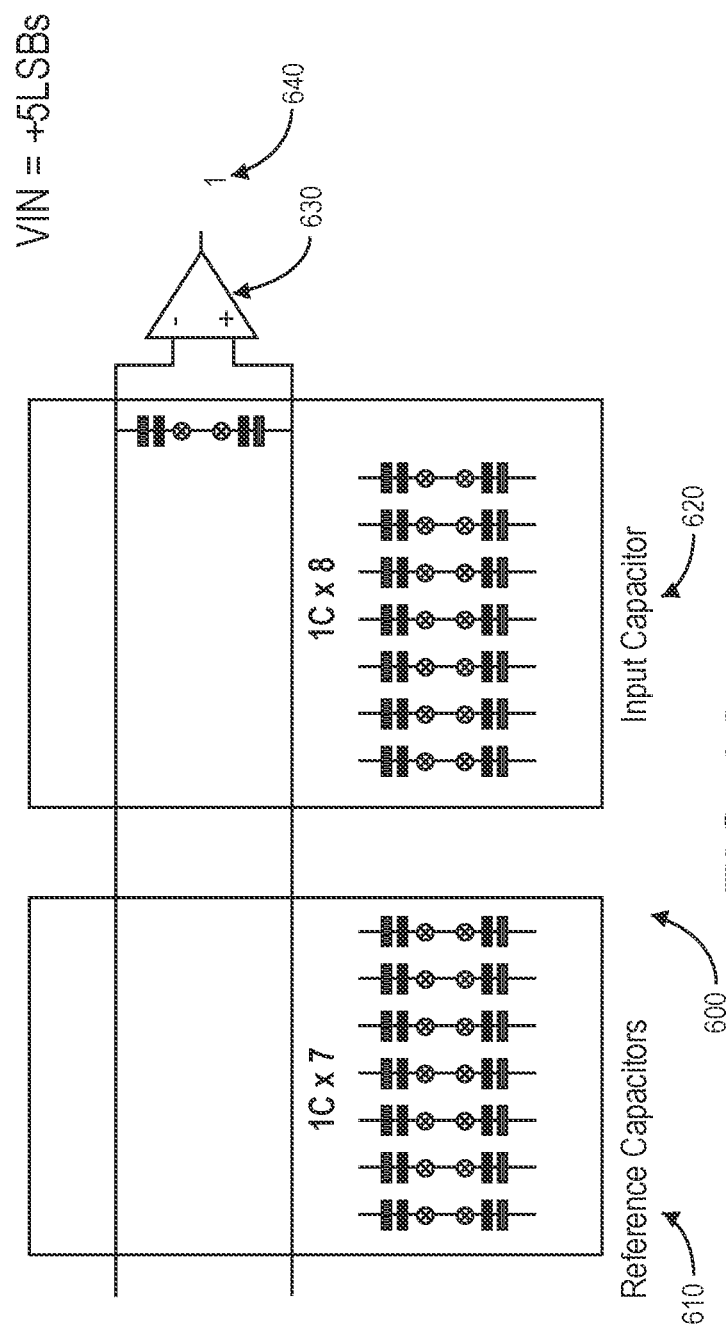
FIGS. 6A-D illustrates the implementation of an exemplary novel successive approximation algorithm in operation, in accordance with others embodiments of the disclosure provided herein.

FIG. 6A commences by measuring the polarity of the voltage state (e.g., charge) across the capacitors. A first input capacitor from input cap bank 620 is applied to comparator 630. The result is "1" 640 to denote positive polarity. This will be used in the application direction of the subsequent reference capacitors. Consequently, the entire reference cap bank is turned upside down and each will be applied in this orientation.

Figure 6B:
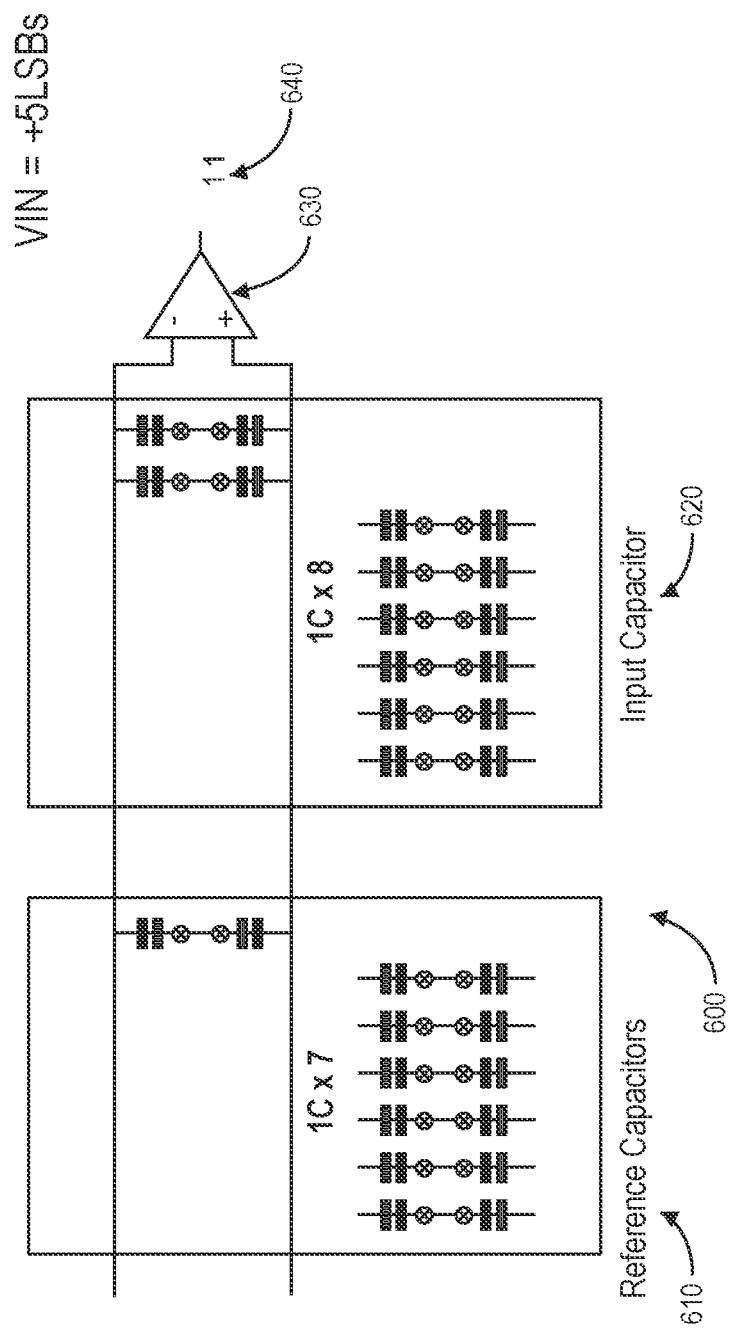

FIG. 6B continues by doubling input capacitors and comparing 1 reference cap from reference capacitors 610 at comparator 630. Because the fractional charge (of +5LSB) on the input capacitor(s)is greater than 1 of the reference capacitors, the most significant bit is determined to be "1" at the comparator 630 because the positive terminal still sees a higher value than the negative terminal. The result is "1 1" 640 to denote positive polarity and MSB.

Figure 6C:
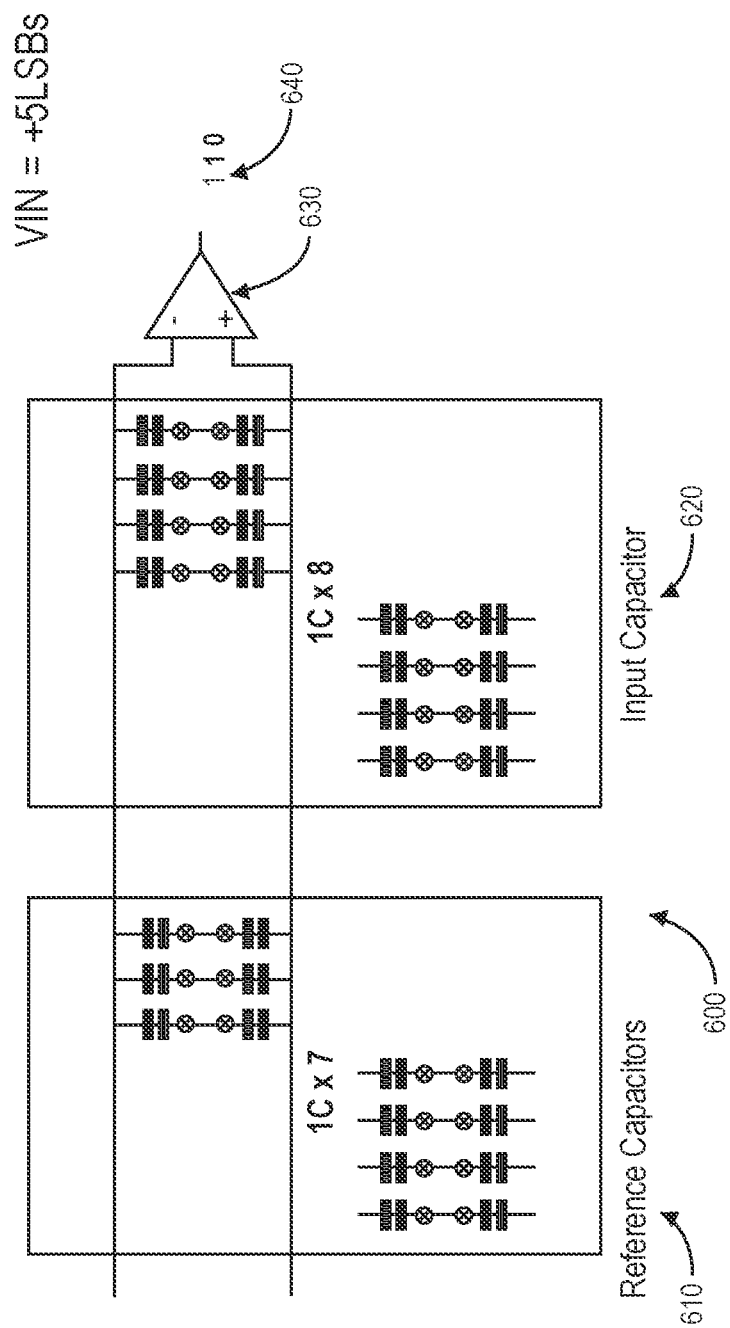

FIG. 6C continues by doubling input capacitors again with a total of 4. Pursuant to the previous discussion associated with FIGS. 2A-F, the first reference cap is doubled (due to immediate prior "1") and another is added. They are compared at comparator 630. Because the fractional charge (of +5LSB) on the input capacitor(s) is less than that of the 3 reference capacitors, the next significant bit is determined to be "0" at the comparator 630 because the positive terminal still sees a lower value than the negative terminal. The result is "1 1 0" 640 to denote positive polarity, MSB and next significant bit.

Figure 6D:
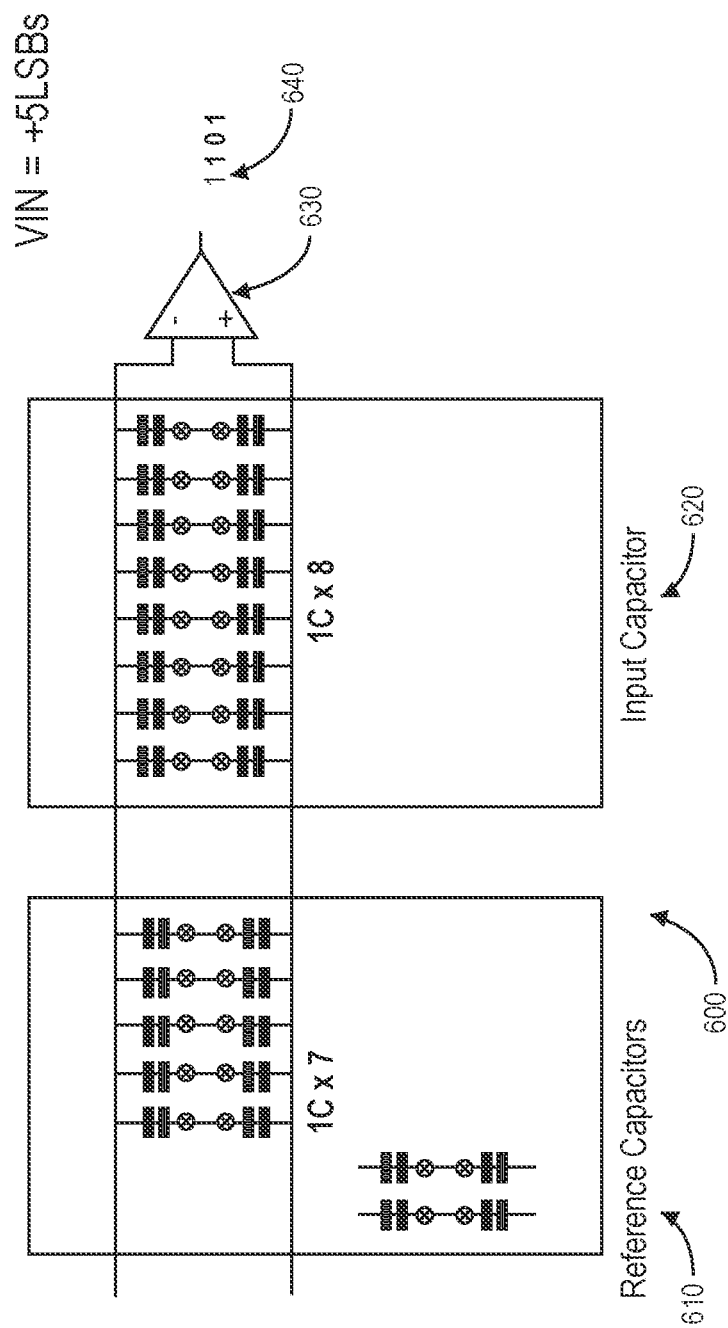

FIG. 6D continues by doubling input capacitors again with a total of 8. Pursuant to the previous discussion associated with FIGS. 2A-F, the first reference cap is doubled again, one cap is removed (due to immediate prior "0") and another is added. They are compared at comparator 630. Because the charge (of +5LSB) on the input capacitor(s) is equal to that of the 5 reference capacitors. The charge on the input capacitor(s) (+5LSB) is now equal to 5C (at full charge). While the comparison is an academic push, a circuit comparator would make some sort of determination, in practice. For the sake of discussion let's say that, the least significant bit is a "1." As a result of sampling, the binary result is determined to be "1 1 0 1" 640.

Parasitic caps are sufficient to achieve the desired attenuation as the input cap is small at start. The present embodiments eliminate the need for large attenuation caps needed to reduce comparators swings. The results in a comparative noise gain of 1+⅝ which increase linearly with input. For example, the comparative noise gain is ~1 for inputs near zero swing and ~2 for inputs near full swing. In contrast, the comparative noise gain is 1+⅞ for that described in association with FIGS. 4A-E irrespective of input.

Figure 7:
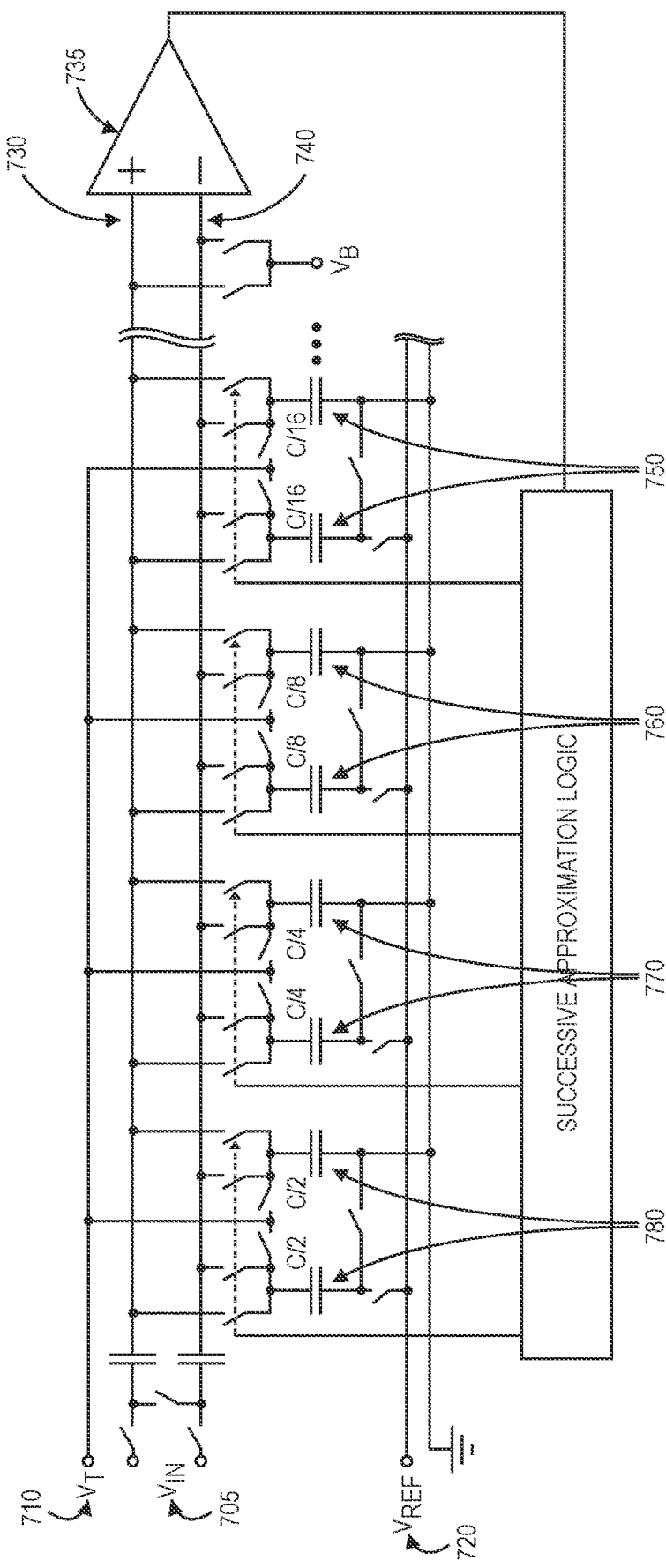
FIG. 7 depicts an exemplary schematic of an exemplary SAR ADC, in accordance with others embodiments of the disclosure provided herein.

FIG. 7 depicts an exemplary schematic of an exemplary TPS SAR ADC 700, in accordance with others embodiments of the disclosure provided herein. As can be appreciated by one skilled in the art, the present disclosure is applicable to top plate switching (TPS) DACs thereby achieving very high speeds of operation.

TPS SAR 700 comprises $V_T$ connector 710, $V_B$ connector 715, $V_{IN}$ 705, $V_{REF}$ 720, comparator 735, first cap pair 780, second cap pair 770, third cap pair 760, fourth cap pair 750, positive comparator lead 740, and negative comparator lead 730. While ADC 700 is depicted to demonstrate implementation of the algorithms discussed herein, the present disclosure is not limited to this architecture in any way.

$V_T$ connector 710 is the voltage threshold. If VT connector 710 is set at $V_{REF}$, this comparator will stay between the rail and not overshoot. $V_B$ connector 715 and can also be used to adjust voltages seen at the comparator. Capacitor are paired up for attenuation purposes with the appropriate switching network to satisfy the previously described conditions. It can be appreciated the cap pairs begin with the most significant bit 580 and end with the least significant bit of cap pair 750. Positive comparator lead 740 and negative comparator lead 730 merely represent prospective inputs to a comparator. One skilled in the art will note this not isolating architecture in that the bottom plates are tied to ground thereby increasing parasitic inductances which may increase LC circuit ringing.

A SAR using a top plate switching (TPS) DAC neatly avoids the undo problem because it can defer connecting a cap-pair until the correct polarity is decide. In practice, the input is sampled the reference voltage is applied to the cap pairs. Next the input cap bottom plates are shorted. Following that the comparator is strobed and C/2 caps are connected in the appropriate polarity. As can be appreciated, strobing and C/4 caps connections continue and so forth.

Figure 8:
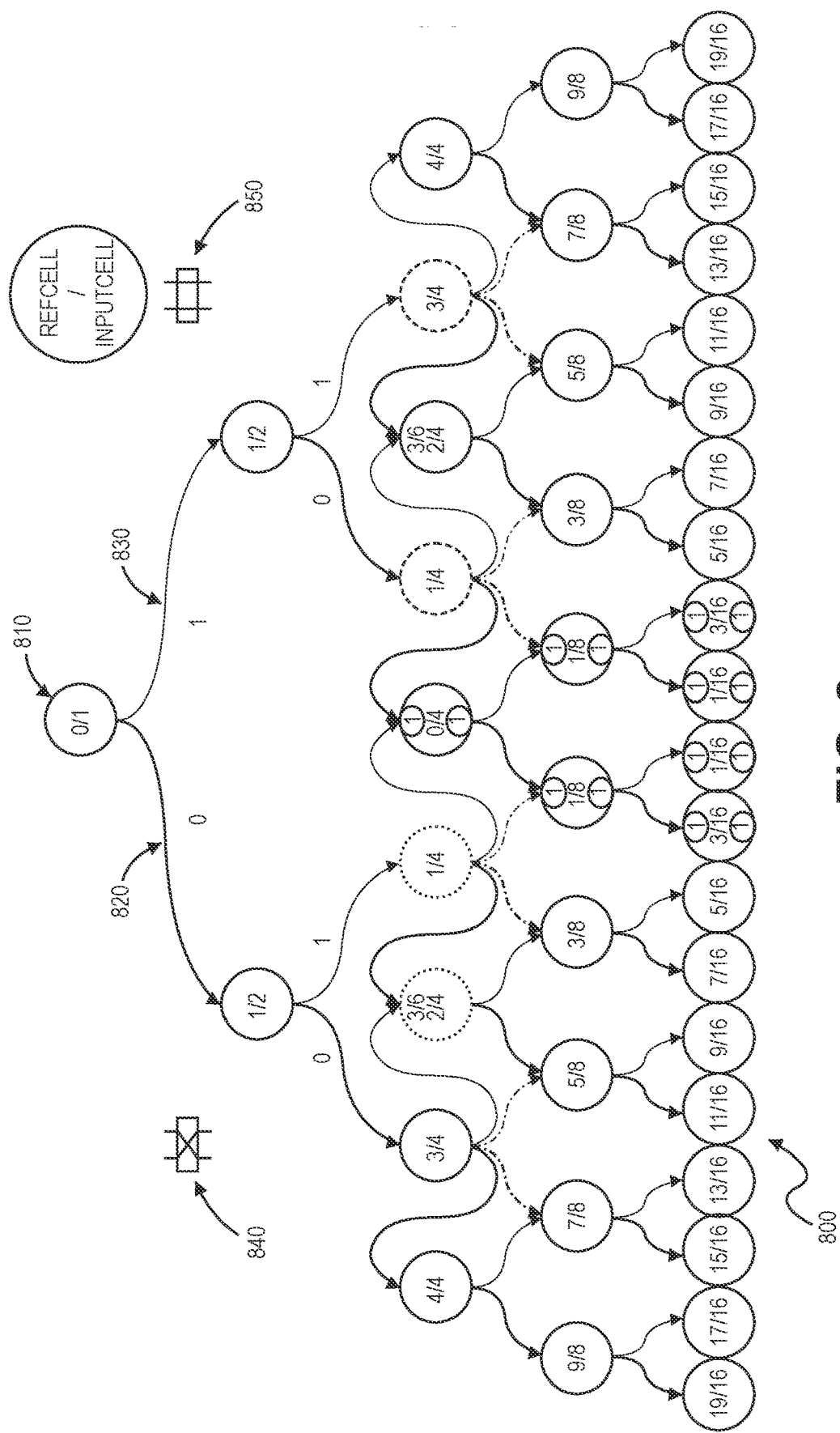
FIG. 8 is a graphical illustration of comparison decision tree, in accordance with others embodiments of the disclosure provided herein.

FIG. 8 is a graphical illustration of comparison decision tree, in accordance with other embodiments of the disclosure provided herein. The decision tree is shown for a fully differential input analog to digital converter. i.e., the input quantity can vary from −REF to +REF (where REF is the magnitude of the reference quantity and in this flow diagram REF is equal to 1). All the states on the right of the state 810 shows decision flow graph for determining a positive polarity input quantity and the section to the left of state 810 depicts the decision flow for an input with negative polarity.

Depending on the input polarity decision after state 810, all the reference cell polarities are flipped if input polarity is negative (flow moves to the left of the graph), or polarity is kept the same and the flow moves towards the right of the decision tree for a positive input polarity. There are also few additional reference cells, called redundant reference cells depicted as small circles inside the states, which are kept at the opposite polarity of the reference cells after sign bit decision, to enable '0' reference cell states as shown in state 8xx.

The decision starts from sign bit evaluation by comparator represented by state 810. Each state has two numbers denoting the number of reference cells and input cells used for bit decision which sets the comparison voltages. From sign bit decision state, the comparison voltages area vin and 0, once the comparator decides '1' indicating that the input quantity is larger than 0, the next state will be the one on right 8xx. Else the next state will be the one on left denoted 8xx. The difference between 8xx and 8xx is that polarity of the reference cell is reversed in 8xx.

Let's take the example of VIN=+0.5/16. And assume that due to some error in the first state, instead of giving an output of '1' the comparator gave an output of '0' forcing the reference cell polarities to be reversed as in 840 and the flow moving to the left side of the flow graph. Now after the second decision we have an additional state called the redundant state that allows for any errors, that decayed by now but caused errors in earlier decisions, to be corrected. In the absence of redundant state the flow graph will move to state 4 (or third bit decision) via the dotted lines.

With redundancy an additional comparison is done at the same level as bit 2, that allows in re-aligning of the search space. So, without the redundancy, the bit decisions will be 0-1-1-1-1 and reach the (−1/16) state. Now with redundancy, after the second trial will result in a 1 that moves the search space back to the state (0/4) from (−1/4). In actual implementation, this transition is enabled by adding additional reference cells that are kept in opposite polarity as that of the rest of the reference cells. So, the state (0/4) has actually two reference cells connected to the comparator. Both of equal magnitude and of opposite polarity. From the state (0/4) the comparator moves down and right to state (1/8) which compares the input 0.5/16 with 2/16.

This comparison gives a result of '0' and the state moves from (1/8) to (1/16). In state (1/16) the comparison is between input at 0.5/16 and reference at 1/16. This results in a '0' and there ends the conversion. The bit decisions we get is 0-1-1-0-0 with redundant bit as '1'. After the digital post processing for a redundant bit of '1' we will get 01100+00100=10000, which is the expected output. The main thing to note here is that we used only one reference cell to shift the redundancy range. This is made possible by the new SAR algorithm where we build up the reference and input cells.

This enables redundancy to be applied only when it is needed as well. In traditional SAR implementations the redundant capacitors need to be proportionately large as the redundancy range that it provides and this redundant capacitor is present at the comparator input irrespective of whether there is a settling error or not. Adding capacitors to the comparator input which are not sampling the analog input acts as attenuation capacitors that reduces the signal swing and therefore the signal to noise ratio of the ADC. The new SAR algorithm enables an efficient use of redundancy that is added only when needed and the magnitude of redundancy capacitor is independent of the redundancy range that it provides.

The SAR algorithm, without the above-mentioned redundancy, for an N bit A/D conversion can succinctly be described as follows:

Step 1: Sample input and reference quantities [input=INP, reference=REF]

Step 2: Split input and reference to M equal parts. where $M=2^N$.
set INP_CELL=INP/M, set REF_CELL=REF/M,
set output array b[1:N]=0; i=1; X=0; Y=0.

Step 3: set b[i]=1; $X=(2^i)$; $Y=1+\Sigma\{b[i].(2^i)\}$ for i=1 to N

Step 4: if (X.INP_CELL>=Y.REF_CELL) then b[i]=1 else b[i]=0.

Step 5: if (i>=N) goto Step 6. else i=(i+1) and go to Step 3.

Step 6: Stop. b[1:N] gives the digital output.

SELECT EXAMPLES

Example 1 provides a method for performing SAR DAC comparison in a SAR ADC comprising dividing an input signal into a plurality of a predetermined number of input cells dividing a reference signal into a plurality of the predetermined number of reference cells, and adding $2^{N-1}$ input cells to an input sum adding $2^N$ reference cells to a reference sum, comparing the input sum to the reference sum.

Example 2 provides a method for performing SAR DAC comparison in a SAR ADC according to any of the preceding and/or proceeding examples, and if the input sum is less than the reference sum, subtracting the 2N reference cells from the reference sum.

Example 3 provides a method for performing SAR DAC comparison in a SAR ADC according to any of the preceding and/or proceeding examples further comprising incrementing N.

Example 4 provides a method for performing SAR DAC comparison in a SAR ADC according to any of the preceding and/or proceeding examples further comprising iterating through N until 2N−1 equals or exceeds the predetermined number of input cells.

Example 5 provides a method for performing SAR DAC comparison in a SAR ADC according to any of the preceding and/or proceeding examples, wherein N is a normal number.

Example 6 provides a method for performing SAR DAC comparison in a SAR ADC according to any of the preceding and/or proceeding examples, wherein N in as integer beginning with 1.

Example 7 provides a method for performing SAR DAC comparison in a SAR ADC according to any of the preceding and/or proceeding examples, wherein the input signal represents a voltage.

Example 8 provides a method for performing SAR DAC comparison in a SAR ADC according to any of the preceding and/or proceeding examples, wherein the input signal represents a charge.

Example 9 provides a method for performing SAR DAC comparison in a SAR ADC according to any of the preceding and/or proceeding examples, wherein the reference signal represents a voltage.

Example 10 provides a method for performing SAR DAC comparison in a SAR ADC according to any of the preceding and/or proceeding examples, wherein the reference signal represents a charge.

Example 11 provides a method for performing SAR DAC comparison in a SAR ADC according to any of the preceding and/or proceeding examples, wherein reference sum is an input to a comparator.

Example 12 provides a method for performing SAR DAC comparison in a SAR ADC according to any of the preceding and/or proceeding examples, wherein input sum is an input to a comparator.

Example 13 provides a method for performing SAR DAC comparison in a SAR ADC according to any of the preceding and/or proceeding examples further comprising producing a binary result from the comparison.

Example 14 provides a method for performing SAR DAC comparison in a SAR ADC according to any of the preceding and/or proceeding examples further comprising producing an N-bit number resulting from the comparison.

Example 15 provides a method for performing SAR DAC comparison in a SAR ADC according to any of the preceding and/or proceeding examples, wherein the N-bit number represents a digital sample of the input signal.

Example 16 provides a method for performing SAR DAC comparison in a SAR ADC according to any of the preceding and/or proceeding examples, wherein the input cells are divided equally.

Example 17 provides a method for performing SAR DAC comparison in a SAR ADC according to any of the preceding and/or proceeding examples, wherein the reference cells are divided equally.

Example 18 provides for a SAR DAC in a SAR ADC comprising a plurality of input capacitors configured to equally divide an input signal, a plurality of reference capacitors configured to equally divide a reference signal, and a comparator having a reference lead and input lead.

Example 19 provides a SAR DAC in a SAR ADC according to any of the preceding and/or proceeding examples further comprising a controller configured to electrically connect $2^{N-1}$ input capacitors to the input lead, electrically connect $2^N$ reference capacitors to the reference lead, evaluate a comparison of the input lead to the reference lead, increment N, if the input lead is less than the reference lead, disconnect the $2^N$ reference capacitor from the reference lead; and iterate through N until $2^{N-1}$ equals or exceeds the number of input capacitors.

Example 20 provides a SAR DAC in a SAR ADC according to any of the preceding and/or proceeding examples, wherein the input signal represents at least one of a voltage, current, and charge.

Example 21 provides a SAR DAC in a SAR ADC according to any of the preceding and/or proceeding examples, wherein the reference signal represents at least one of a voltage, current, and charge.

Example 22 provides a SAR DAC in a SAR ADC according to any of the preceding and/or proceeding examples, wherein the controller is configured to produce an N-bit number resulting from the comparison.

Example 23 provides a SAR DAC in a SAR ADC according to any of the preceding and/or proceeding examples, wherein the N-bit number represents a digital sample of the input signal.

Example 24 provides for an apparatus for performing SAR DAC comparison in a SAR ADC comprising a means for dividing an input signal into a plurality of a predetermined number of input cells, a means for dividing a reference signal into a plurality of the predetermined number of reference cells, a means for adding 2N−1 input cells to an input sum, a means for adding 2N reference cells to a reference sum, a means for comparing the input sum to the reference sum and if the input sum is less than the reference sum, subtracting the 2N reference cells from the reference sum, a means for incrementing N, and a means for iterating through N until 2N−1 equals or exceeds the predetermined number of input cells.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A method for performing SAR DAC comparison in a SAR ADC comprising:
    dividing an input signal into a plurality of a predetermined number of input cells;
    dividing a reference signal into a plurality of the predetermined number of reference cells;
    adding $2^{N-1}$ input cells to an input sum;
    adding $2^N$ reference cells to a reference sum;
    comparing the input sum to the reference sum and:
        if the input sum is less than the reference sum, subtracting the $2^N$ reference cells from the reference sum; and
    incrementing N;
    iterating through N until $2^{N-1}$ equals or exceeds the predetermined number of input cells.

2. The method according to claim 1, wherein N is a normal number.

3. The method according to claim 2, wherein N in as integer beginning with 1.

4. The method according to claim 1, wherein the input signal represents a voltage.

5. The method according to claim 1, wherein the input signal represents a charge.

6. The method according to claim 1, wherein the reference signal represents a voltage.

7. The method according to claim 1, wherein the reference signal represents a charge.

8. The method according to claim 1, wherein reference sum is an input to a comparator.

9. The method according to claim 1, wherein input sum is an input to a comparator.

10. The method according to claim 1, producing a binary result from the comparison.

11. The method according to claim 1, producing an N-bit number resulting from the comparison.

12. The method according to claim 1, wherein the N-bit number represents a digital sample of the input signal.

13. The method according to claim 1, wherein the input cells are divided equally.

14. The method according to claim 1, wherein the reference cells are divided equally.

15. A SAR DAC in a SAR ADC comprising:
a plurality of input capacitors configured to equally divide an input signal;
a plurality of reference capacitors configured to equally divide a reference signal;
a comparator having a reference lead and input lead;
a controller configured to:
  electrically connect $2^{N-1}$ input capacitors to the input lead;
  electrically connect $2^N$ reference capacitors to the reference lead;
  evaluate a comparison of the input lead to the reference lead;
  increment N;
  if the input lead is less than the reference lead, disconnect the $2^N$ reference capacitor from the reference lead; and
  iterate through N until $2^{N-1}$ equals or exceeds the number of input capacitors.

16. The SAR DAC according to claim 15, wherein the input signal represents at least one of a voltage, current, and charge.

17. The SAR DAC according to claim 15, wherein the reference signal represents at least one of a voltage, current, and charge.

18. The SAR DAC according to claim 15, wherein the controller is configured to produce an N-bit number resulting from the comparison.

19. The SAR DAC according to claim 18, wherein the N-bit number represents a digital sample of the input signal.

20. An apparatus for performing SAR DAC comparison in a SAR ADC comprising:
means for dividing an input signal into a plurality of a predetermined number of input cells;
means for dividing a reference signal into a plurality of the predetermined number of reference cells;
means for adding $2^{N-1}$ input cells to an input sum;
means for adding $2^N$ reference cells to a reference sum;
means for comparing the input sum to the reference sum and:
  if the input sum is less than the reference sum, subtracting the $2^N$ reference cells from the reference sum; and
means for incrementing N; and
means for iterating through N until $2^{N-1}$ equals or exceeds the predetermined number of input cells.

* * * * *